United States Patent [19]
Kato et al.

[11] Patent Number: 4,724,182
[45] Date of Patent: Feb. 9, 1988

[54] THIN FILM CIRCUIT SUBSTRATE

[75] Inventors: Masakazu Kato, Furukawa; Takashi Shirakawa, Morioka, both of Japan

[73] Assignee: Alps Electric Co., Ltd., Japan

[21] Appl. No.: 934,567

[22] Filed: Nov. 25, 1986

[30] Foreign Application Priority Data

Nov. 17, 1985 [JP] Japan ............................. 60-284111

[51] Int. Cl.⁴ .................. B32B 3/00; B32B 15/00; H05B 1/00; G01D 15/10
[52] U.S. Cl. ................................ 428/210; 428/409; 428/432; 428/901; 219/216; 219/543; 346/76 PH
[58] Field of Search .......... 428/210, 901, 409, 432; 219/216, 216 PH, 543; 346/76 PH

[56] References Cited

U.S. PATENT DOCUMENTS 4,340,635  7/1982  Langman et al. .............. 428/164
4,343,986  8/1982  Mitani et al. ................... 219/216

Primary Examiner—John E. Kittle
Assistant Examiner—Patrick J. Ryan
Attorney, Agent, or Firm—Guy W. Shoup

[57] ABSTRACT

Disclosed is a thin film circuit substrate which comprises an electrically insulating substrate, and at least one conductor layer and one protecting layer which are formed on the substrate, the insulating substrate having a surface roughness which is equal to or smaller than 0.1 μRa when measured as a center line average height. The thin film circuit substrate is suitable for use, for example, in a thermal head.

3 Claims, 6 Drawing Figures

THIN FILM CIRCUIT SUBSTRATE

BACKGROUND OF THE INVENTION

1. Field of the Invention

The present invention relates to a thin film circuit substrate comprising at least one conductor layer and one protecting layer formed on an electrically insulating substrate, and particularly relates to a thin film circuit substrate which is suitable for a thermal head.

2. Description of the Prior Art

Generally, a thermal head has such a structure that a glass glaze layer is partially formed on an electrically insulating substrate of alumina or the like, and, thereon, a heat-generating resistor layer, a conductor layer, an oxidization-proof layer, and a wear-proof layer are successfully formed. In this case, the oxidization-proof layer and the wear-proof layer are provided to protect the conductor layer. Such a thin film circuit substrate provided with a conductor layer and a protecting layer formed on an insulating substrate as described above is widely used in various fields.

Conventionally, in such a thin film circuit substrate of the kind described above, however, the surface accuracy of its insulating substrate has not been regarded as of major importance. Therefore, when a conductor layer 2 was formed on an insulating layer 1 and a protecting layer 3 was further formed thereon, the conductor layer 2 and the protecting layer 3 was not flat but zigzag with excessive ups and downs in section as seen in FIG. 2, due to unevenness of the surface of the insulating substrate 1. Therefore, pin holes 4 were considerably formed due to the zigzag portions in the protecting layer 3. Further, in the case of a thermal head, during fabrication erroneous contact with the human finger may occur in handling. Accordingly, there has been such problems that chlorine ions contained in sweat of a human body or the like comes into contact with the conductor layer 2 through the pin holes 4 and particularly in an atmosphere of high temperature and high humidity the conductor layer 2 is corroded to cause disconnection.

SUMMARY OF THE INVENTION

It is therefore an object of the present invention to solve the problems in the prior art as described above.

It is another object of the present invention to provide a thin film circuit substrate which is superior in reliability because no corrosion is generated in the conductor layer even if the circuit surface is fingered so that there occur few faults due to the disconnection.

In order to attain the above objects, the thin film circuit substrate according to the present invention is featured in that the insulating substrate has a surface roughness equal to or less than 0.1 μRa when expressed by a center line average roughness. Here, the term "center line average height" means a roughness measured in accordance with "Center Line Average Height (Ra)" defined in JIS (Japanese Industrial Standard), Standard B0601.

The above and other objects and features of the invention will appear more fully hereinafter from a consideration of the following description taken in connection with the accompanying drawings.

DETAILED DESCRIPTION OF PREFERRED EMBODIMENTS

Figure 1:
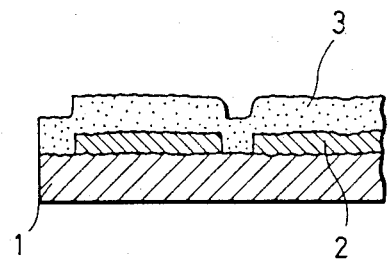
FIG. 1 is a cross-section typically showing the thin film circuit substrate according to the present invention.
Figure 2:
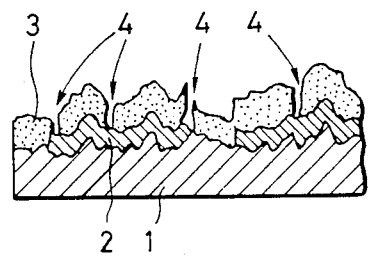
FIG. 2 is a cross-section schematically showing a conventional thin film circuit substrate.

FIG. 1 typically shows a cross-section of a thin film circuit substrate according to the present invention. When the surface roughness of a insulating substrate 1 is made to be equal or less than 0.1 μRa, a conductor layer 2 and a protecting layer 3 formed on the insulating substrate 1 become relatively flat as seen in FIG. 1, so that it is possible to prevent pin holes from being produced in the protecting layer 3. Accordingly, when the circuit substrate is applied, for example, to a thermal head, the conductor layer 2 is completely covered with the protecting layer 3, so that the chlorine ions or the like are prevented from penetrating and the conductor layer 2 can be prevented from being corroded even if the surface of the circuit is fingered. Therefore, it becomes possible to much improve the reliability of the thermal head. If the surface roughness of the insulating substrate 1 exceeds 0.1 μRa, it becomes difficult to sufficiently obtain the effects according to the present invention.

Insulating substrates having the required surface smoothness can be obtained commercially, for example, an alumina substrate of HA series manufactured by NGK Spark Plug.

Figure 3:
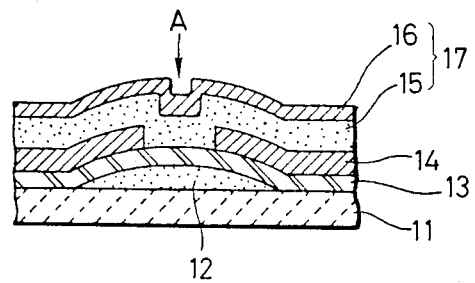
FIG. 3 is a cross-section showing a part of an embodiment of the present invention suitable for use in a thermal head.
Figure 4:
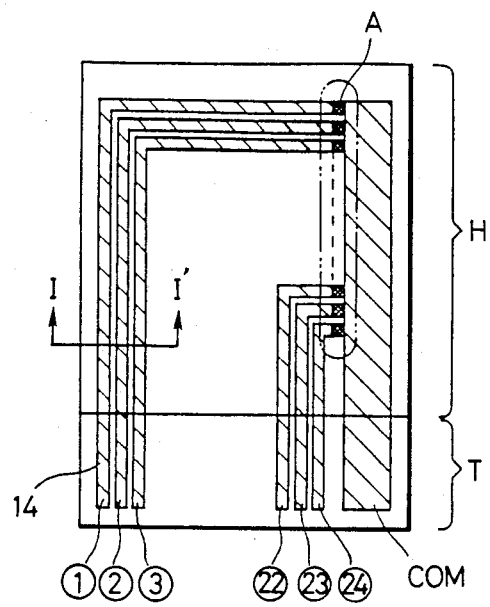
FIG. 4 is a plan view of the thermal head.
Figure 5:
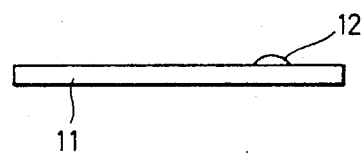
FIG. 5 is a schematic side view of the thermal head.

FIGS. 3 through 5 show an embodiment of the present invention when it is used for a thermal head.

As shown in FIG. 3, paste of a mixture of glass frits and organic binder is screen-printed on an insulating substrate 11 made of alumina and sintered to partially form a glass glaze layer 12. A heat-generating resistor layer 13 is then formed to a thickness of 0.05 μm by spattering onto the insulating substrate 11 and the glass glaze layer 12. Then, an aluminum thin film having a thickness of 1.5 μm is formed by spattering onto the heat-generating resistor layer 13 and a conductor layer 14 is formed by patterning the aluminum thin film as shown in FIG. 4. The conductor layer 14 is patterned into individual electrodes (1), (2), (3), ... (22), (23), (24) and a common electrode COM. among which heat-generating dot portions A are formed. An oxidization-proof layer 15 made of $SiO_2$ of 2 μm thick and a wear-proof layer 16 made of $TaOx$ ( $x \leq 2.5$) of 5 μm thick are laminated in succession on a head surface H except a terminal portion T. The oxidization-proof layer 15 and the wear-proof layer 16 constitute a protecting layer 17 according to the present invention. FIG. 5 is a side view of the thermal head of FIG. 4, and shows a state that the partially formed glass glaze layer 12 is projected from the insulating substrate 11.

According to the present invention, the insulating substrate 11 is selected to have a surface roughness of equal to or less than 0.1 μRa. By using such an insulating substrate 11 having good surface accuracy, it is possible to make the conductor layer 14 and the protecting layer 17 comparatively flat in cross-section along the line I—I in FIG. 4 as explained in FIG. 1 so that it is possible to make the protecting layer 17 have no pin holes. Therefore, corrosion never occurs in the conductor layer 14 even if the circuit surface is fingered, thereby preventing faults such as disconnection from being generated.

EXAMPLE

Thermal heads shown in FIGS. 3 through 5 were produced by using an alumina substrate (having a surface roughness of 0.075 μRa) containing alumina of 99.5% as the insulating substrate 11. For example, an alumina substrate HA-995 made by NGK Spark Plug was used. Further, to compare with the above-mentioned thermal head, other thermal heads similar to that shown in FIGS. 3 through 5 were made by using an alumina substrate (having a surface roughness of 0.4 μRa) containing alumina of 97%. For example, an alumina substrate HA-97 made by NGK Spark Plug was used.

Figure 6:
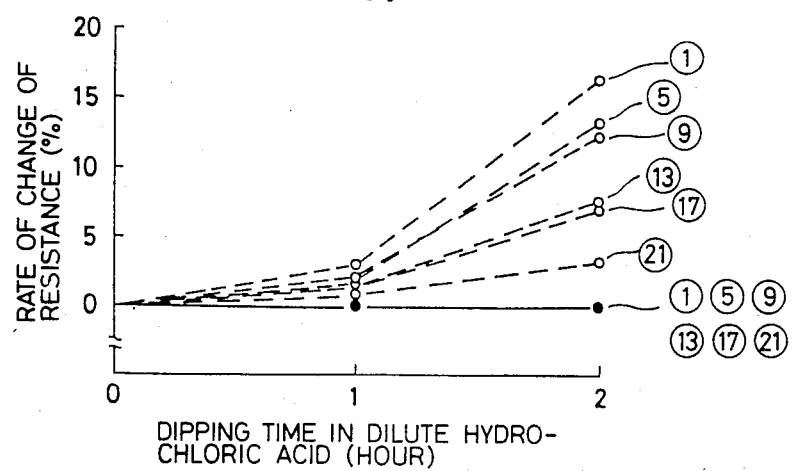
FIG. 6 is a diagram showing the result of comparison in corrosion-resisting properly between the thermal head according to the present invention and the conventional one.

Then, the terminal portion T of each of the thermal heads was coated with resin and the thermal heads were dipped in dilute hydrochloric acid (HCl:H$_2$O=1:4 volume ratio; at a room temperature). The dipping was effected for one hour and two hours respectively for the thermal heads of the present invention, and respectively for the conventional thermal heads. Then, the thermal heads were cleaned with water and dried. The terminal portion T of each thermal head was peeled, and a probe was applied across the common electrode COM and each of the individual electrodes (1), (2), (3), . . . (22), (23), (24) at the terminal portion T to thereby measure a resistance value at each of the dots including resistance of line conductors. In this manner, the rate of change in resistance relative to an initial resistance value at each dot is obtained, the result of which is as shown in FIG. 6. In FIG. 6, the symbol ●—● shows the case of the thermal heads according to the present invention in which the alumina substrate (having the surface roughness of 0.075 μRa) containing alumina of 99.5% was used, while the symbol O—O shows the case of the conventional thermal heads in which the alumina substrate (having the surface roughness of 0.4 μRa) containing alumina of 97% was used.

In FIG. 6, it is found that the value of change in resistance after dipping the thermal heads for two hours was zero in the case of the thermal heads according to the present invention, while the resistance value increased in the case of the conventional thermal heads. In the conventional thermal heads, although pin holes formed in the protecting layer on the head surface could not be confirmed in surface observation by means of a microscope, it can be considered from the following reasons that the above-mentioned increase in resistance value was caused by corrosion of aluminum due to dilute hydrochloric acid which penetrated through the pin holes generated in the protecting layer.

(1) During dipping of the thermal heads in dilute hydrochloric acid, a number of bubbles (which are considered to be hydrogen) were generated from the conventional thermal heads, while no bubbles were generated from the thermal heads according to the present invention.

(2) In FIG. 6, it is proved that the longer the time of dipping of the thermal heads was made, the more the resistance value was increased. This is considered to be due to the corrosion caused by dilute hydrochloric acid.

(3) In FIG. 6, the smaller the number of each of the individual electrodes (1), (2), (3), . . . (22), (23), and (24) becomes, the more the resistance value increases. That is, in the case where the number is smaller, the length of the aluminum conductor line is longer, so that it is considered that probability of touching the pin holes in the protecting layer is large and corroded portions generated in the aluminum line are increased.

As described above, according to the present invention, the surface roughness of the insulating substrate is selected to be equal to or less than 0.1 μRa, so that the conductor layer and the protecting layer formed on the insulating substrate become relatively flat and it is possible to prevent pin holes from being generated in the protecting layer. Therefore, when the circuit substrate is used, for example, for a thermal head, chlorine ions or the like are prevented from penetrating and the conductor layer can be prevented from being corroded even if the circuit surface is fingered, because the conductor layer is completely covered with the protecting layer. Accordingly, the reliability of the device can be much improved. Because the increase in conductor resistance due to corrosion of the conductor layer can be prevented from occurring, consumption of electric power in the conductor layer can be reduced in view of power saving. Further, in the case where the alumina substrate having good surface accuracy, that is, containing a large quantity of alumina is used as the insulating substrate, thermal conductivity of the substrate is improved to make the conduction of heat good so that, in a thermal head, the thermal responsibility can be improved. Further, in the thermal head, disconnection hardly occurs at portions of the conductor pattern rising to the partial glaze layer becomes and also the roughness on the inside surface of the glaze layer can be made smaller.

What is claimed is:

1. A thin film circuit substrate comprising:
   an electrically insulating substrate made of a ceramic material and having a surface with a low surface roughness which is equal to or less than 0.1 μRa when measured as a centerline average height;
   a conductor layer formed on said surface of said substrate, and a protecting layer formed on said conductor layer,
   wherein the low surface roughness of the insulating substrate allows the conductor and protecting layers to be formed without substantial surface unevenness such as might cause pin holes in the protecting layer and a resulting corrosion of the conductor layer to occur.

2. A thermal head having a thin film circuit substrate comprising:
   an electrically insulating substrate made of a ceramic material and having a surface with a low surface roughness which is equal to or less than 0.1 μRa when measured as a centerline average height;
   a conductor layer formed on said surface of said substrate, and a protecting layer formed on said conductor layer,
   wherein the low surface roughness of the substrate allows the conductor and protecting layers to be formed without substantial surface uneveness such as might cause pin holes in the protecting layer and a resulting corrosion of the conductor layer to occur.

3. A method of forming a thin film circuit substrate comprising:
  providing an electrically insulating substrate made of a ceramic material and having a surface with a low surface roughness which is equal to or less than 0.1 μRa when measured as a centerline average height;
  forming a conductor layer on said surface of said substrate, and a protecting layer on said conductor layer,
  wherein the low surface roughness of the substrate allows the conductor and protecting layers to be formed without substantial surface uneveness such as might cause pin holes in the protecting layer and a resulting corrosion of the conductor layer to occur.

* * * * *